(12) United States Patent
Berman et al.

(10) Patent No.: US 10,400,350 B1
(45) Date of Patent: Sep. 3, 2019

(54) METHOD AND APPARATUS FOR REMOVING PAINT ON METALLIC COMPONENTS

(71) Applicants: Solomon Berman, Carmel, IN (US); Daesung Chong, Yorktown, IN (US); Ashok Ramaswamy, Carmel, IN (US)

(72) Inventors: Solomon Berman, Carmel, IN (US); Daesung Chong, Yorktown, IN (US); Ashok Ramaswamy, Carmel, IN (US)

(73) Assignee: IBC Materials & Technologies, Inc., Lebanon, IN (US)

( * ) Notice: Subject to any disclaimer, the term of this patent is extended or adjusted under 35 U.S.C. 154(b) by 22 days.

(21) Appl. No.: 15/490,429

(22) Filed: Apr. 18, 2017

Related U.S. Application Data

(60) Provisional application No. 62/325,282, filed on Apr. 20, 2016.

(51) Int. Cl.
*C23F 4/00* (2006.01)
*C25F 5/00* (2006.01)
*H01J 37/32* (2006.01)

(52) U.S. Cl.
CPC .......... *C25F 5/00* (2013.01); *C23F 4/00* (2013.01); *H01J 37/32321* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 2,480,845 A | * | 9/1949 | Frager | C25F 1/00 205/712 |
| 3,900,376 A | * | 8/1975 | Copsey | C23G 5/00 204/211 |
| 5,622,612 A | * | 4/1997 | Mihara | H01M 4/661 205/138 |
| 5,700,366 A | * | 12/1997 | Steblianko | C25D 5/08 205/102 |

\* cited by examiner

*Primary Examiner* — Kishor Mayekar
(74) *Attorney, Agent, or Firm* — Hartman Global IP Law; Gary M. Hartman; Domenica N. S. Hartman

(57) ABSTRACT

An apparatus for removing paint from a metallic component. The apparatus includes an electrolytic cell in which the metallic component is an anode, and a DC power supply capable of producing a plasma causing the paint from the metallic component to disintegrate. A method of depainting a metallic component includes providing an electrolytic cell with the metallic component to be depainted acting as an anode. A DC power supply connected to the cathode and anode is activated to produce a plasma causing the paint from the metallic component to disintegrate. Another method of method of depainting a metallic component includes providing an aqueous solution of sodium hydrogen carbonate, sodium citrate, and potassium oxalate as an electrolyte, a cathode and a pained metallic component as an anode. A DC power supply connected to the cathode and anode produces a plasma causing the paint from the painted metallic component to disintegrate.

11 Claims, 6 Drawing Sheets

US 10,400,350 B1

METHOD AND APPARATUS FOR REMOVING PAINT ON METALLIC COMPONENTS

CROSS-REFERENCE TO RELATED APPLICATIONS

The present U.S. patent application is related to and claims the priority benefit of U.S. Provisional Patent Application Ser. No. 62/325,282, filed Apr. 20, 2016 the contents of which are hereby incorporated by reference in their entirety into the present disclosure.

TECHNICAL FIELD

The present disclosure generally relates to methods of paint removal on metallic components, such as, but not limited to, structural components used in, but not limited to, aircrafts.

BACKGROUND

This section introduces aspects that may help facilitate a better understanding of the disclosure. Accordingly, these statements are to be read in this light and are not to be understood as admissions about what is or is not prior art.

There are many situations wherein paint on a metallic component is desired to be removed. For purposes of this disclosure, a component is meant to be a structural component or a physical component of a mechanical system or an implement providing a utility. Those of skill in the art will recognize that the methods and apparatus of this disclosure will apply to a broad range of metallic components. Such situations, namely where paint on a metallic component has to be removed, include but are not limited to inspection of components where the paint can interfere with the inspection process or techniques, and removing defective or degrading paint in order to put on fresh paint. Further, in some situations, where multiple layers of paint or other substances exist, one or more of these layers may have to be removed. Methods of such paint removal to date include blasting by plastic media and chemical processes. These methods typically require specialized equipment, are expensive and/or are not environmentally friendly.

It is desirable to have environmentally friendly, cost-effective techniques that remove layers of paint and other substances on metallic components or other objects completely or selectively.

SUMMARY

An apparatus for removing paint from a metallic component is disclosed. The apparatus includes a tank containing a liquid electrolyte, a cathode immersed in the liquid electrolyte, a painted metallic component acting as an anode immersed in the liquid electrolyte, and a DC power supply connected to the anodes and cathodes to form an electrolytic cell, the electrolytic cell being capable of producing a plasma near the painted component, such that the paint from the painted metallic component disintegrates into pieces falling into the liquid electrolyte, thereby resulting in a depainted metallic component.

A method of depainting a metallic component is disclosed. The method includes providing a tank containing a liquid electrolyte and a cathode immersed in the liquid electrolyte. A metallic component to be depainted is immersed into the liquid electrolyte to act as an anode. A DC power supply is connected to the anode and cathode to form an electrolytic cell capable of producing a plasma near the painted metallic component. The DC power supply is activated to produce a plasma near the painted metallic component for a duration such that the paint from the painted metallic component disintegrates into pieces falling into the liquid electrolyte, thereby resulting in a depainted metallic component.

Another method of depainting a metallic component is disclosed. The method includes providing a tank containing an aqueous solution of sodium hydrogen carbonate, sodium citrate and potassium oxalate. The aqueous solution acts as a liquid electrolyte. The tank also contains a cathode made of 316 SS immersed in the liquid electrolyte. A painted metallic component is immersed into the liquid electrolyte to act as an anode. A DC or pulsed DC power supply capable of producing over 200 volts is connected to the anode and cathode to form an electrolytic cell capable of producing a plasma near the painted metallic component. The DC power supply is activated to produce a plasma near the painted metallic component for about 5 minutes such that the paint from the painted metallic component disintegrates into pieces falling into the liquid electrolyte, thereby resulting in a depainted metallic component.

BRIEF DESCRIPTION OF DRAWINGS

While some of the figures shown herein may have been generated from scaled drawings or from photographs that are scalable, it is understood that such relative scaling within a figure are by way of example, and are not to be construed as limiting.

DETAILED DESCRIPTION

Figure 1:
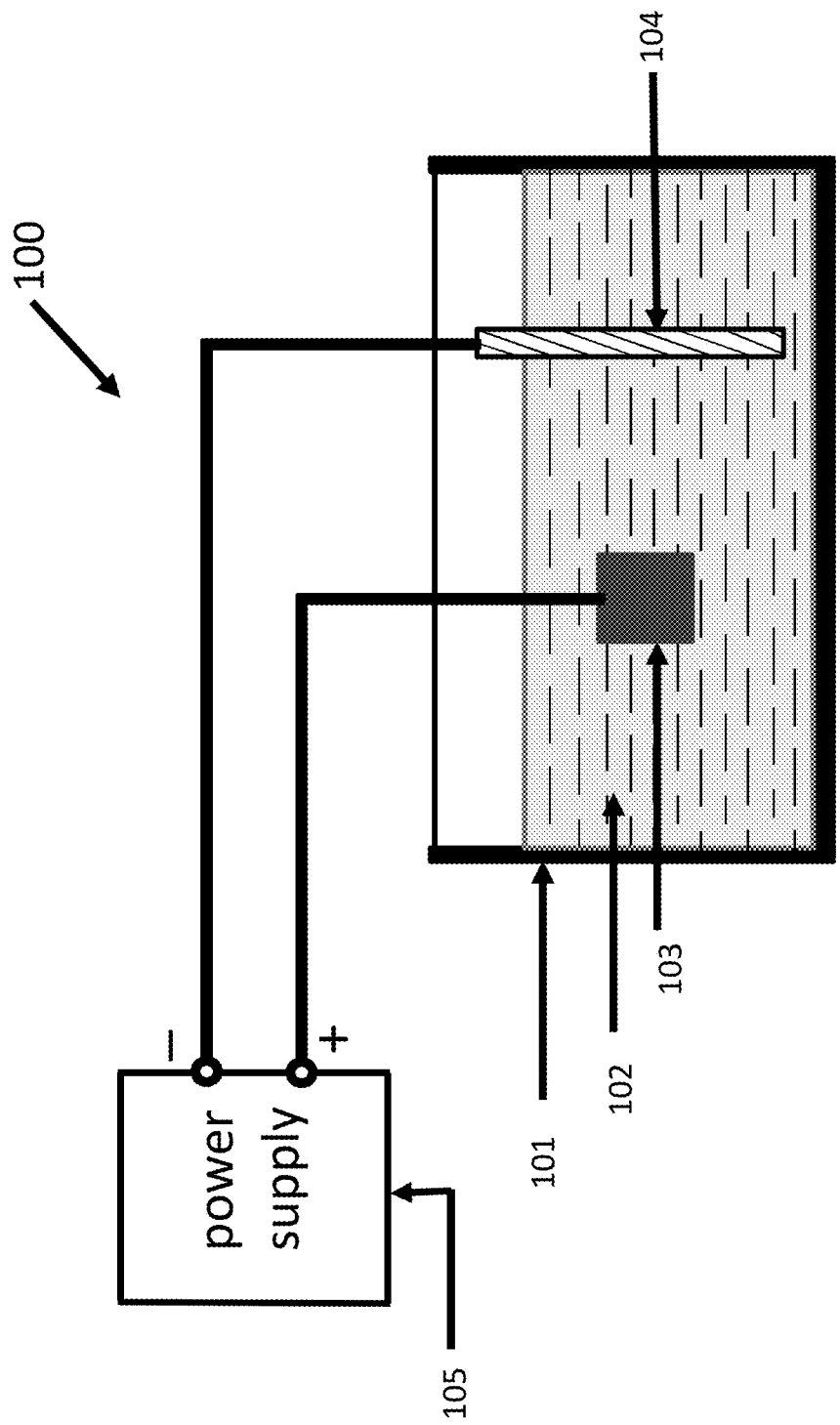
FIG. 1 is a schematic representation of one embodiment of apparatus that can be used for depainting according to this disclosure.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended, such alterations and further modifications in the illustrated device, and such further applications of the principles of the disclosure as illustrated therein being contemplated as would normally occur to one skilled in the art to which the disclosure relates.

FIG. 1 is a schematic representation of one embodiment of an apparatus 100 according to this disclosure for use in depainting a metallic component. In this disclosure, the word "depainting" is used to mean removing paint from a metallic component or its surface. An entire layer may or may not be removed as a single entity. In many instances, a layer of paint or a primer used in the painting process disintegrates into pieces. The apparatus 100 comprises an electrolytic cell, as described below. Referring to FIG. 1, 101 represents a tank comprising a liquid electrolyte 102. A non-limiting example of electrolyte 102 is an aqueous solution with a pH in the range of 5-9. Examples of electrolytes suitable for purposes of this disclosure include, but are not limited to aqueous solution of ammonium salts or potassium salts or sodium salts. Salts suitable for this purpose include, but not limited to ammonium chloride, ammonium fluoride, ammonium sulfate, ammonium citrate, ammonium hydrogen carbonate, ammonium carbonate, ammonium oxalate, ammonium formate, ammonium acetate, ammonium nitrate, sodium chloride, sodium fluoride, sodium sulfate, sodium phosphate, sodium hydrogen carbonate, sodium carbonate, sodium oxalate, sodium formate, sodium acetate, sodium nitrate, potassium chloride, potassium fluoride, potassium sulfate, potassium phosphate, potassium hydrogen carbonate, potassium carbonate, potassium oxalate, potassium formate, potassium acetate, and potassium nitrate. It should be noted that the aqueous solution used as the electrolyte can contain more than one salt, such as two, three or more salts. In FIG. 1, 103 represents a metallic component (or part) comprising a layer or layers of paint which is desired to be removed and forms an anode. In FIG. 1, 104 is a cathode. As a non-limiting example, cathode 104 can be made of stainless steel, a non-limiting example of which is, SS 316. SS 316 is a designation of stainless steel known to those skilled in the art. As a non-limiting example, 103 can be a component made of aluminum or its alloys. In this example, 103 can further contain an anodized layer with a paint layer on top of the anodized layer. Referring again to FIG. 1, 105 represents a DC or pulsed DC power supply suitably connected to the electrodes (anodes and cathode) so as to form an electrolytic cell. It should be noted that the methods an apparatuses of this disclosure can utilize DC or pulsed DC. Voltages indicated would refer to peak voltage when pulsed DC is employed.

In operation, a DC or pulsed DC voltage is applied to an electrolytic cell as shown in FIG. 1. Referring again to FIG. 1, under the action of this voltage, a plasma (not shown) is created in the vicinity of the part 103 containing a painted section or surface. The plasma so created acts to affect the integrity of adhesion of paint to the metallic component 103 or the adhesion of paint to a layer of another material (such as an anodized layer) which is part of the metallic component 103, in such a way that the paint loses adhesion and disintegrates and falls into the electrolyte as particles or agglomerates of particles of chunks of particles. In practice, the paint layer or layers also contain a primer material which is applied to a surface prior to painting. The primer material also disintegrates in this paint removal process of this disclosure and can be removed by filtration of the electrolyte containing the removed paint and/or removed primer.

It should be noted that while one anode (the metallic component) and one cathode are shown, it is possible to utilize counter electrodes, thus having more than two electrodes in the electrolytic cell of FIG. 1. The methodology of employing counter electrodes is known to those skilled in the art.

It should be further noted that the apparatus shown in FIG. 1 can be enhanced or modified by including a draining, and filtration system for the electrolyte, so that the pieces of the disintegrated paint and primer can be captured.

Figure 2B:
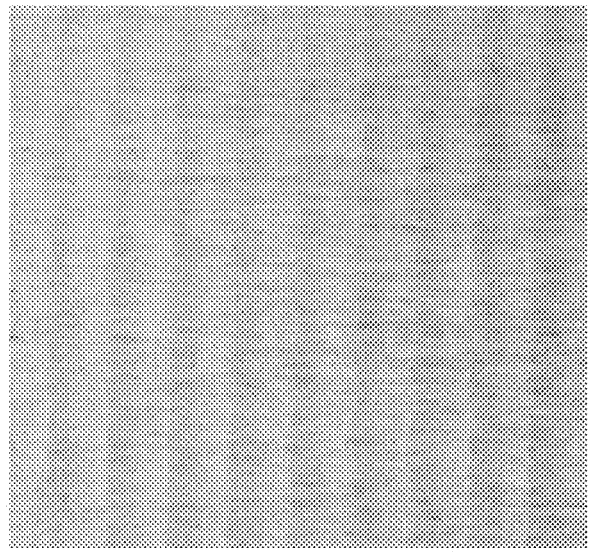
FIGS. 2A and 2B show images of a metallic component made of Al 7075 alloy before and after paint removal, respectively.
Figure 2A:
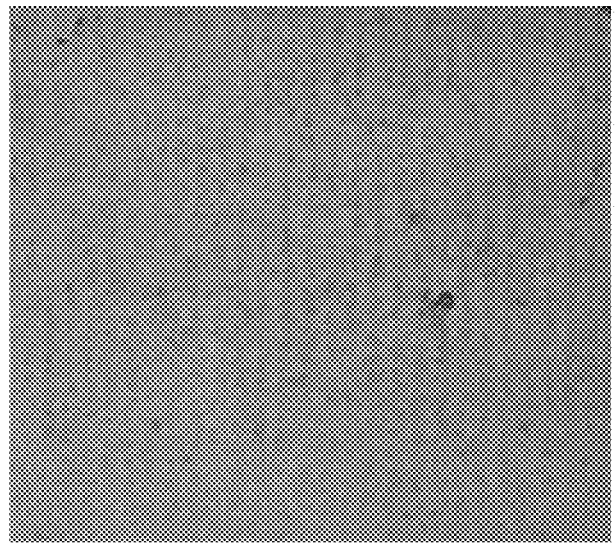

The degree of disintegration of the primer and paint depends on the strength of the plasma, which in turn depends on the voltage applied to the electrolytic cell, the current density of the anode and the duration of the plasma created. FIGS. 2A and 2B show images of a component made of Al 7075 alloy (known to those skilled in the art) before and after paint removal, respectively. The duration of plasma to achieve the surface shown in FIG. 2B is approximately 5 minutes utilizing an aqueous electrolyte solution with pH in the range of 5-9 and applying a voltage over 200 Volts. The strength of a plasma is related to applied voltage and the current density created on the anode. In the experiments leading to this disclosure, the current density on the anode varied between 0.18 to 0.24 Amperes/square centimeter. It should be noted that shorter and longer times are possible depending on the thickness of the painted layers, composition of the paint and primer, for the duration of the plasma to achieve acceptable results. In this disclosure, the above described depainting process will be referred to as Plasma Electrolytic Depainting Process (PEDP), and the depainting method as s PEDP treatment.

Figure 3A:
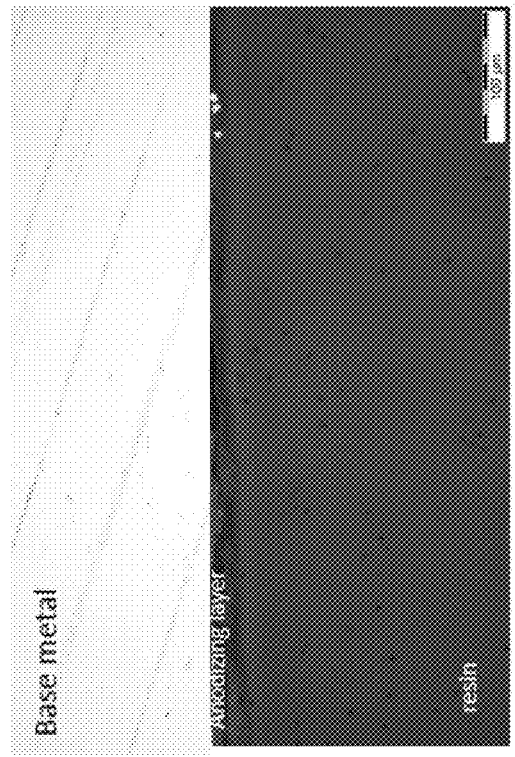
FIG. 3A represents a cross-sectional image of a part made of Al 7075 alloy having an anodized layer with a painted surface.
Figure 3B:
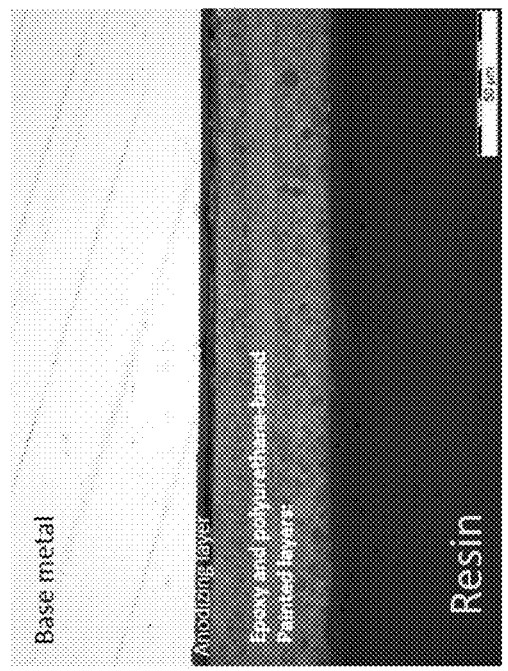
FIG. 3B shows the part in FIG. 3A after the paint layers have been removed utilizing the process and apparatus of this disclosure.

FIG. 3A represents a cross-sectional optical microscopy image of a part made of Al 7075 having an anodized layer with a painted surface. In FIG. 3A, it can be seen that there is layer of epoxy and polyurethane-based painted layers adherent to and on top of an anodized layer which is on top and adherent to the base metal. FIG. 3B shows a cross-sectional optical microscopy image of a structure similar to the one in FIG. 3A, but after a depainting or PEPD treatment is completed, showing that the paint layers have been removed utilizing the process and apparatus of this disclosure as described above. In both the figures, namely FIGS. 3A and 3B, the layer marked resin represents the mounting compound used in the preparation of the optical microscopy samples in producing the images, as is generally understood by those skilled in the art.

Figure 4:
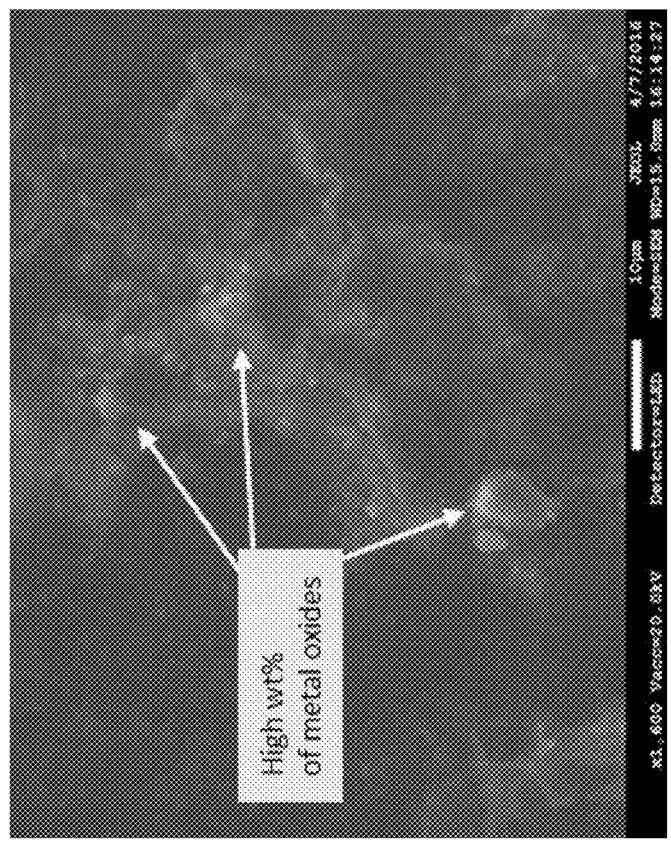
FIG. 4 is an SEM image of a painted surface prior to PEDP treatment.
Figure 5:
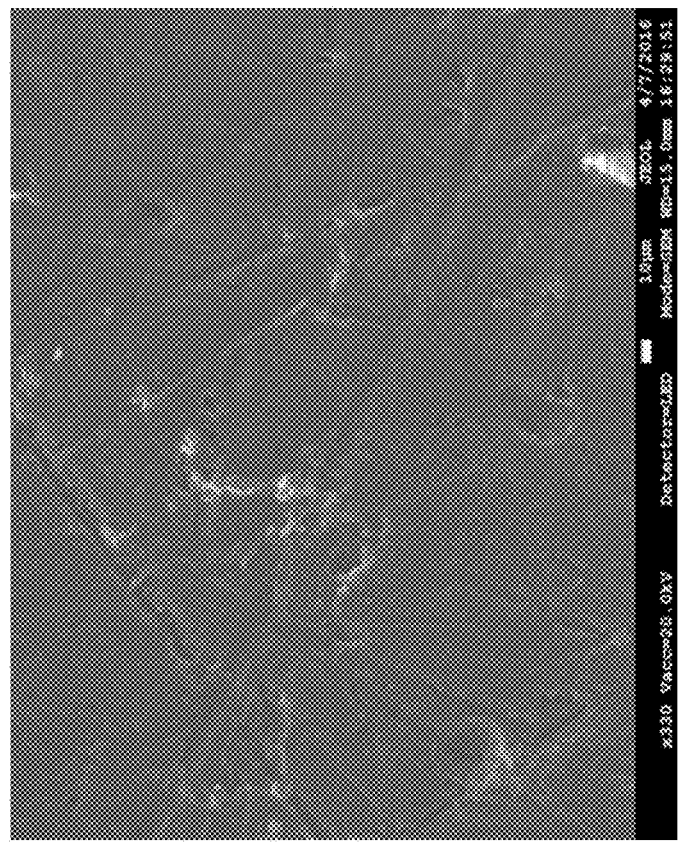
FIG. 5 is an SEM image of the surface of FIG. 4 after subjecting to PEDP treatment.

FIG. 4 is a Scanning Electron Microscope (SEM) image of a painted surface of a component made of Al 7075 alloy prior to PEDP treatment showing high level of metal oxides (through Energy Dispersive Spectroscopy (EDS) analysis), in part of the aluminum alloy substrate captured in FIG. 4. X-ray Diffraction pattern analysis of painted parts before PEDP treatment detected the presence of many elements and compounds contained in the paint and primer, as well as aluminum from Al 7075 alloy. The surface after the PEDP treatment can be called depainted surface. FIG. 5 is an SEM image of the surface of FIG. 4 after subjecting to PEDP treatment. In other words FIG. 5 is an SEM image of depainted surface of Al 7075 alloy. It should be noted that in FIG. 5, the paint layer has been removed exposing the anodized layer on which the original paint was adhering, showing that integrity of the anodized layer has been preserved. EDS analysis of the depainted surface confirmed that the exposed layer of the depainted part is anodized layer.

Figure 6:
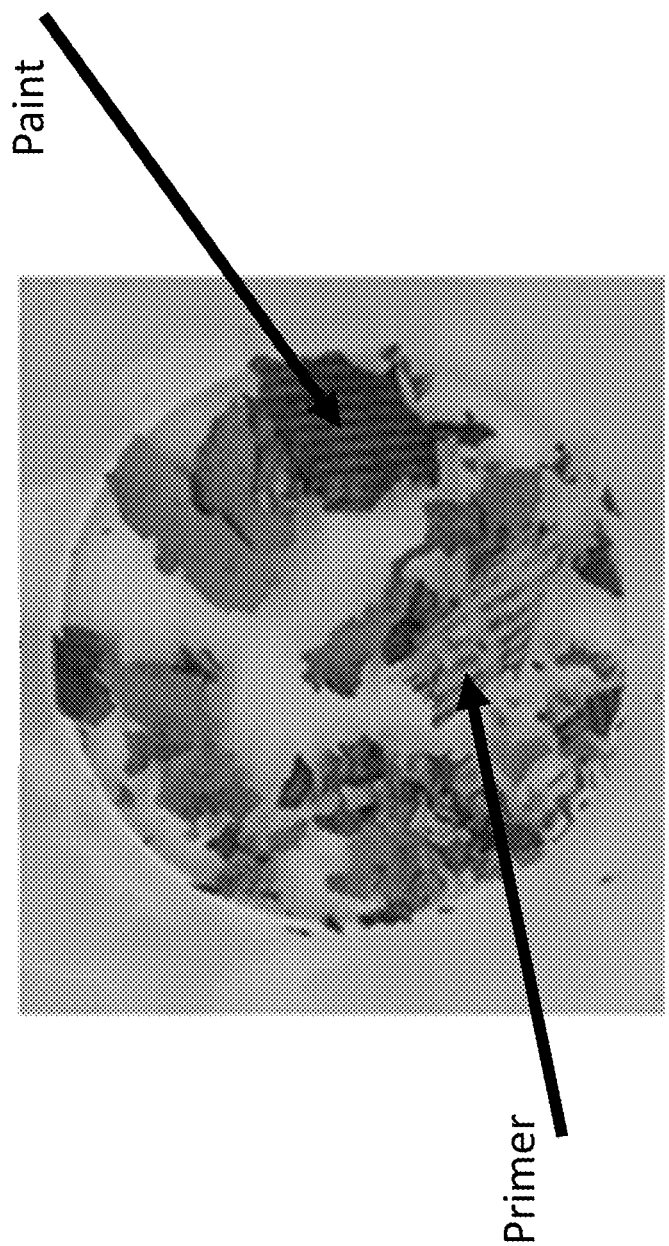
FIG. 6 shows representative areas of primer and paint removed from the metallic component.

FIG. 6 is an image of pieces of the primer and paint removed from the part made of Al 7075 shown FIG. 2A. In FIG. 6, representative pieces of primer and paint removed from the metallic component by the PEDP treatment of this disclosure are marked. These pieces are obtained by filtration of the electrolyte used in the PEDP treatment after the PEDP treatment of the metallic component is completed.

It should be noted that, for a given size of the metallic component and its composition, by proper selection of the combination of voltage for electrolytic cell of this disclosure and the plasma duration in the PEDP treatment. In particular, by a proper combination of the electrolytic cell voltage and plasma duration, paint layers can be removed selectively, without damaging the integrity of the anodized layer prevailing in, for example, the Al 7075 alloy, and adhesion of the anodized layer to the base alloy.

The PEDP treatment of this disclosure can be useful in achieving depainting of metallic components used in many industries. A non-limiting example is aerospace industry.

Based on the above detailed description, it is an objective of this disclosure to describe an apparatus for removing paint from a metallic component. The apparatus includes a tank containing a liquid electrolyte, a cathode immersed in the liquid electrolyte, a painted metallic component acting as an anode immersed in the liquid electrolyte, and a DC or pulsed DC power supply connected to the anode and cathode to form an electrolytic cell, wherein the electrolytic cell capable of producing a plasma near the painted metallic component, such that the paint from the metallic component disintegrates into pieces falling into the liquid electrolyte, thereby resulting in a depainted metallic component. In some embodiments of the apparatus of this disclosure, the liquid electrolyte is an aqueous solution of a salt. Salts suitable for this purpose include but not limited to ammonium salts, sodium salts, and potassium salts. Non-limiting examples of ammonium salts are: ammonium chloride, ammonium fluoride, ammonium sulfate, ammonium citrate, ammonium hydrogen carbonate, ammonium carbonate, ammonium oxalate, ammonium formate, ammonium acetate, and ammonium nitrate. Non-limiting examples of sodium salts suitable for the apparatus of this disclosure are sodium chloride, sodium fluoride, sodium sulfate, sodium phosphate, sodium hydrogen carbonate, sodium carbonate, sodium oxalate, sodium formate, sodium acetate, and sodium nitrate. Non-limiting examples of potassium salts suitable for the apparatus of this disclosure are potassium chloride, potassium fluoride, potassium sulfate, potassium phosphate, potassium hydrogen carbonate, potassium carbonate, potassium oxalate, potassium formate, potassium acetate, and potassium nitrate. In some embodiments of the apparatus, more than one salt can be used. A non-limiting example of using more than one salt can include usage of an ammonium salt, a sodium salt and a potassium salt or combinations thereof. Materials suitable for a cathode of this apparatus include, but not limited to stainless steel, such as, but not limited to SS316. In some embodiments of the apparatus, the metallic component which is depainted can be made of an alloy. In some embodiments, the alloy can be an aluminum alloy, such as, but not limited to Al 7075. In some embodiments of the apparatus, the DC or pulsed DC power supply is capable of producing 1000 Volts. In some embodiments of the apparatus, a draining and filtration system for the liquid electrolyte, capable of capturing the pieces falling into the liquid electrolyte, can be incorporated.

It is another objective of this disclosure to describe a method of depainting a metallic component. The method includes providing a tank containing a liquid electrolyte and a cathode immersed in the liquid electrolyte, immersing a metallic component to be depainted into the liquid electrolyte to act as an anode, providing a DC power supply connected to the anodes and cathode to form an electrolytic cell capable of producing a plasma near the painted metallic component, and activating the DC power supply to produce a plasma near the painted metallic component for a duration such that the paint from the metallic component disintegrates into pieces falling into the liquid electrolyte, thereby resulting in a depainted metallic component. In some embodiments of the method, of this disclosure, the liquid electrolyte is an aqueous solution of a salt. Salts suitable for this purpose include but not limited to ammonium salts, sodium salts, and potassium salts. Non-limiting examples of ammonium salts are: ammonium chloride, ammonium fluoride, ammonium sulfate, ammonium citrate, ammonium hydrogen carbonate, ammonium carbonate, ammonium oxalate, ammonium formate, ammonium acetate, and ammonium nitrate. Non-limiting examples of sodium salts suitable for the apparatus of this disclosure are sodium chloride, sodium fluoride, sodium sulfate, sodium phosphate, sodium hydrogen carbonate, sodium carbonate, sodium oxalate, sodium formate, sodium acetate, and sodium nitrate. Non-limiting examples of potassium salts suitable for the apparatus of this disclosure are potassium chloride, potassium fluoride, potassium sulfate, potassium phosphate, potassium hydrogen carbonate, potassium carbonate, potassium oxalate, potassium formate, potassium acetate, and potassium nitrate. In some embodiments of the apparatus, more than one salt can be used. A non-limiting example of using more than one salt can include use of an ammonium salt, a sodium salt and a potassium salt or combinations thereof. Materials suitable for a cathode of this method include, but not limited to stainless steel, such as, but not limited to SS316. In some embodiments of the method, the metallic component which is depainted can be made of an alloy. In some embodiments, the alloy can be an aluminum alloy, such as, but not limited to Al 7075. In some embodiments of the method, the DC or pulsed DC power supply is capable of producing 1000 Volts. In some embodiments of the apparatus, a draining and filtration system for the liquid electrolyte, capable of capturing the pieces falling into the liquid electrolyte, can be incorporated. In some embodiments of the method, the metallic component is an aircraft component. In some preferred embodiments, the metallic component is or part of an aircraft wheel. In some embodiments, the wheel comprises an aluminum alloy, such as but not limited to Al 7075. In some embodiments of the method, the duration of activating the DC power supply is in the range of 1-30 minutes.

In some embodiments of the method of this disclosure, the method of depainting a metallic component includes providing a tank containing an aqueous solution of sodium hydrogen carbonate in the range of, 2-28%, sodium citrate <9%, and potassium oxalate <12%, as a liquid electrolyte with a pH of 8, and 316 SS as cathode immersed in the liquid electrolyte, immersing a metallic component made of an aluminum alloy, such as but not limited to Al 7075 or Al 2014, to be depainted into the liquid electrolyte to act as an anode, providing a DC power supply connected to the anodes and cathode to form an electrolytic cell capable of producing a plasma near the painted metallic component, and activating the DC power supply producing a voltage of more than 200 volts to produce a plasma near the painted metallic component for a duration in the range of 1-30 minutes such that the paint from the painted metallic component disintegrates into pieces falling into the liquid electrolyte, thereby resulting in a depainted metallic component.

The scope of this disclosure is not limited to aluminum and its alloys as the materials from which depainting is achieved. Components made of other materials such as titanium alloys, nickel alloys and steel alloys are also suitable for depainting by the PEDP treatment described of this disclosure. Further, the power supply can be configured to provide DC or pulsed DC voltages up to 1000 Volts nominal but can be smaller or greater than 1000 volts as required for the operation. The pH of the electrolyte can vary in the range of 3-12. Further, it should be stressed that, while several embodiments described in this disclosure make reference to DC power supply, it is an objective of this disclosure to assert that pulsed DC supply can be employed in place of DC power supply in all the embodiments of this disclosure.

It should be recognized that the methods and apparatus of this disclosure are applicable to a variety of metallic components in a variety of applications and industry. A non-limiting example of an industry is the aircraft industry wherein many metallic components such as, but not limited to aircraft wheels, require depainting. Similarly many equipments including but not limited to military equipment such as, but not limited to weapons systems, have metallic components that need depainting. In all the applications, the methods and apparatus of this disclosure are applicable to a variety of metals and alloys. That is, the metallic components to be depainted, in aircraft or other industries, can be made of aluminum, steel, titanium or other metals and alloys.

In some situations, such as for inspection of high stress areas for cracks, it may be required that paint be removed from a metallic component only in selected areas. Such selective depainting can be achieved by suitably masking the anode (masking methods are known to those skilled in the art) thereby preventing the masked areas from the effects of plasma and hence the depainting.

While the invention has been described in terms of specific embodiments, including particular configurations, it is apparent that other forms could be adopted by one skilled in the art. Accordingly, it should be understood that the invention is not limited to the specific disclosed embodiments. Other implementations are possible. Therefore, the scope of the invention is to be limited only by the following claims.

The invention claimed is:

1. A method of depainting a painted metallic component, the method comprising:
  providing a tank containing a liquid electrolyte and a cathode immersed in the liquid electrolyte;
  immersing a painted metallic component to be depainted into the liquid electrolyte to act as an anode, wherein the painted metallic component contains a primer and one or more layers of a paint;
  providing a DC power supply connected to the anode and cathode to form an electrolytic cell capable of producing a plasma near the painted component;
  activating the DC power supply to produce a plasma near the painted metallic component; and
  selecting a voltage for the electrolytic cell formed by the cathode, the anode and the liquid electrolyte and a duration of the plasma such that the primer and the one or more layers of the paint from the painted metallic component disintegrates into pieces falling into the liquid electrolyte, thereby resulting in a depainted metallic component.

2. The method of claim 1, wherein the liquid electrolyte is an aqueous solution of one of an ammonium salt, a potassium salt and a sodium salt.

3. The method of claim 1, wherein the cathode is made of a stainless steel SS 316.

4. The method of claim 1, wherein the painted metallic component to be depainted comprises an aluminum alloy.

5. The method of claim 4, wherein the aluminum alloy is Al 7075 or Al 2014.

6. The method of claim 4, wherein the aluminum alloy comprises an anodization layer.

7. The method of claim 6, wherein the voltage and the duration of the plasma are selected such that integrity of the anodization layer and its adhesion to the aluminum alloy are undamaged.

8. The method of claim 1, wherein the DC power supply is capable of producing voltages up to 1000 volts.

9. The method of claim 1, the duration is in the range of 1-30 minutes.

10. The method of claim 1, wherein the depainting of the metallic component is in selected areas of the metallic component.

11. The method of claim 1, wherein the metallic component belongs to an aircraft.

* * * * *